(12) United States Patent
Fryette

(10) Patent No.: US 10,020,781 B2
(45) Date of Patent: Jul. 10, 2018

(54) NOISE CANCELLATION IN AMPLIFIER SYSTEMS

(71) Applicant: Steven M. Fryette, Valley Glen, CA (US)

(72) Inventor: Steven M. Fryette, Valley Glen, CA (US)

(73) Assignee: Steven M. Fryette, Valley Glen, CA (US)

( * ) Notice: Subject to any disclaimer, the term of this patent is extended or adjusted under 35 U.S.C. 154(b) by 2 days.

(21) Appl. No.: 15/411,827

(22) Filed: Jan. 20, 2017

(65) Prior Publication Data

US 2017/0207754 A1 Jul. 20, 2017

Related U.S. Application Data

(60) Provisional application No. 62/281,183, filed on Jan. 20, 2016.

(51) Int. Cl.
*H03F 1/30* (2006.01)
*H03F 3/02* (2006.01)
*H03F 1/56* (2006.01)

(52) U.S. Cl.
CPC ............ *H03F 1/30* (2013.01); *H03F 1/565* (2013.01); *H03F 3/02* (2013.01); *H03F 2200/372* (2013.01); *H03F 2200/387* (2013.01)

(58) Field of Classification Search
CPC ........................................................ H03F 1/30
See application file for complete search history.

(56) References Cited

U.S. PATENT DOCUMENTS

| 2,896,491 | A | | 7/1959 | Lover | |
|---|---|---|---|---|---|
| 2,921,266 | A | | 1/1960 | Kiebert, Jr. | |
| 3,210,668 | A | * | 10/1965 | Stull, Jr. | H03K 17/54 327/406 |
| 3,263,207 | A | * | 7/1966 | West | H04B 11/00 330/298 |
| 3,475,706 | A | * | 10/1969 | Browder | H03H 7/01 333/169 |
| 4,066,975 | A | | 1/1978 | Key et al. | |
| 4,670,692 | A | | 6/1987 | Meigs | |
| 4,719,431 | A | | 1/1988 | Karsten | |
| 6,140,870 | A | * | 10/2000 | Cook | H03F 3/181 330/118 |
| 6,424,324 | B1 | | 7/2002 | White et al. | |
| 6,937,093 | B2 | | 8/2005 | Tekushan | |
| 7,173,488 | B2 | | 2/2007 | Smith | |
| 8,848,944 | B1 | | 9/2014 | Civiletti | |

(Continued)

OTHER PUBLICATIONS

"The Valve Wizard", obtained Jan. 16, 2016, from website http://www.valvewizard.co.uk/cathodyne.html, 6 pages.

(Continued)

*Primary Examiner* — Patricia T Nguyen
(74) *Attorney, Agent, or Firm* — Eric D. Jorgenson, Esq.

(57) ABSTRACT

A low power amplifier architecture that employs a single-ended (single triode) push-pull (SEPP) vacuum tube and output transformer arrangement, and that cancels unwanted amplifier signal components such as hum and noise. The SEPP amplifier operates to cancel power supply ripple and local EMI induced noise in the output transformer by providing reverse polarity of the primary coils of the output transformer.

15 Claims, 3 Drawing Sheets

(56) References Cited

U.S. PATENT DOCUMENTS

| | | | | |
|---|---|---|---|---|
| 9,203,365 B1* | 12/2015 | Milbert | ................... | H03F 5/00 |
| 2003/0231781 A1* | 12/2003 | Billington | ............... | H04R 1/00 |
| | | | | 381/124 |
| 2005/0001680 A1* | 1/2005 | Ratzel | ............... | G01R 33/3621 |
| | | | | 330/165 |
| 2012/0243586 A1* | 9/2012 | Bendixen | .............. | H03H 11/22 |
| | | | | 375/219 |

OTHER PUBLICATIONS

"Comments on Mesa Boogie U.S. Pat. No. 7,173,488" entitled "Switchable Single-Ended, Push-Pull Guitar Amp", obtained from website https://www.ampbooks.com/mobile/amp-technology/amp-patent-7173488, on Jan. 16, 2016, 7 pages.

* cited by examiner

NOISE CANCELLATION IN AMPLIFIER SYSTEMS

CROSS-REFERENCE TO RELATED APPLICATIONS

This application claims the benefit of U.S. Provisional Patent Application Ser. No. 62/281,183 entitled "NOISE CANCELLATION IN AMPLIFIER SYSTEMS" and filed Jan. 20, 2016, the entirety of which is incorporated by reference herein.

BACKGROUND

The elimination or management of undesirable signals (e.g., generally, as noise) in electrical/electronic systems is a never-ending design challenge. For example, in an amplifier system that employs a typical push-pull amplifier, undesirable signal components generated by the power supply transformer include power supply ripple and local EMI induced noise.

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

The disclosed architecture comprises a cancellation circuit that removes or reduces unwanted amplifier signal components such as hum (e.g., the sound associated with 50-60 Hz (Hertz) alternating current of the power-line frequency, approximates 100-120 Hz) and noise signals (random fluctuations in electrical/electronic signals).

The cancellation circuit comprises a single-ended (single triode) push-pull (SEPP) low power vacuum tube amplifier suitably implemented to cancel hum and noise that can be introduced by a nearby power supply transformer and locally-induced electromagnetic interference (EMI) that may occur via the electromagnetic coupling between conductors.

Additionally, the cancellation circuit and low power requirements further enable the design and implementation of the power supply subsystems and the output transformer in close proximity to each other yielding a small form factor (or footprint) in the overall chassis design not considered possible in traditional amplifier systems (e.g., guitar) of equivalent power output.

Similar to a typical push-pull (P-P) amplifier, undesirable noise components generated by the power supply transformer include power ripple and local EMI induced noise. However, the SEPP amplifier operates to cancel power supply ripple and local EMI induced noise in the output transformer (e.g., audio) of the SEPP amplifier by providing reverse polarities (e.g., 180 degrees) of the primary coils of the output transformer.

The SEPP amplifier differs from a conventional push-pull amplifier in that the coils are separate, with a coil connected in the plate circuit of the driving tube and a coil connected in the cathode circuit of the driving tube. The SEPP is a single-ended triode stage floating between the positive and negative phase of the AC (alternating current) cycle, which does not require a phase inverter since the SEPP is inherently phase inverting. Thus, the SEPP does not produce (eliminates) the classic "crossover notch" (e.g., a transfer curve distortion in class AB and/or class B amplifiers due to a bias point change that results in non-linear portions in the operating curves) which occurs during the phase transition of a typical Class AB amplifier, for example.

To the accomplishment of the foregoing and related ends, certain illustrative aspects are described herein in connection with the following description and the annexed drawings. These aspects are indicative of the various ways in which the principles disclosed herein can be practiced and all aspects and equivalents thereof are intended to be within the scope of the claimed subject matter. Other advantages and novel features will become apparent from the following detailed description when considered in conjunction with the drawings.

DETAILED DESCRIPTION

Figure 1:
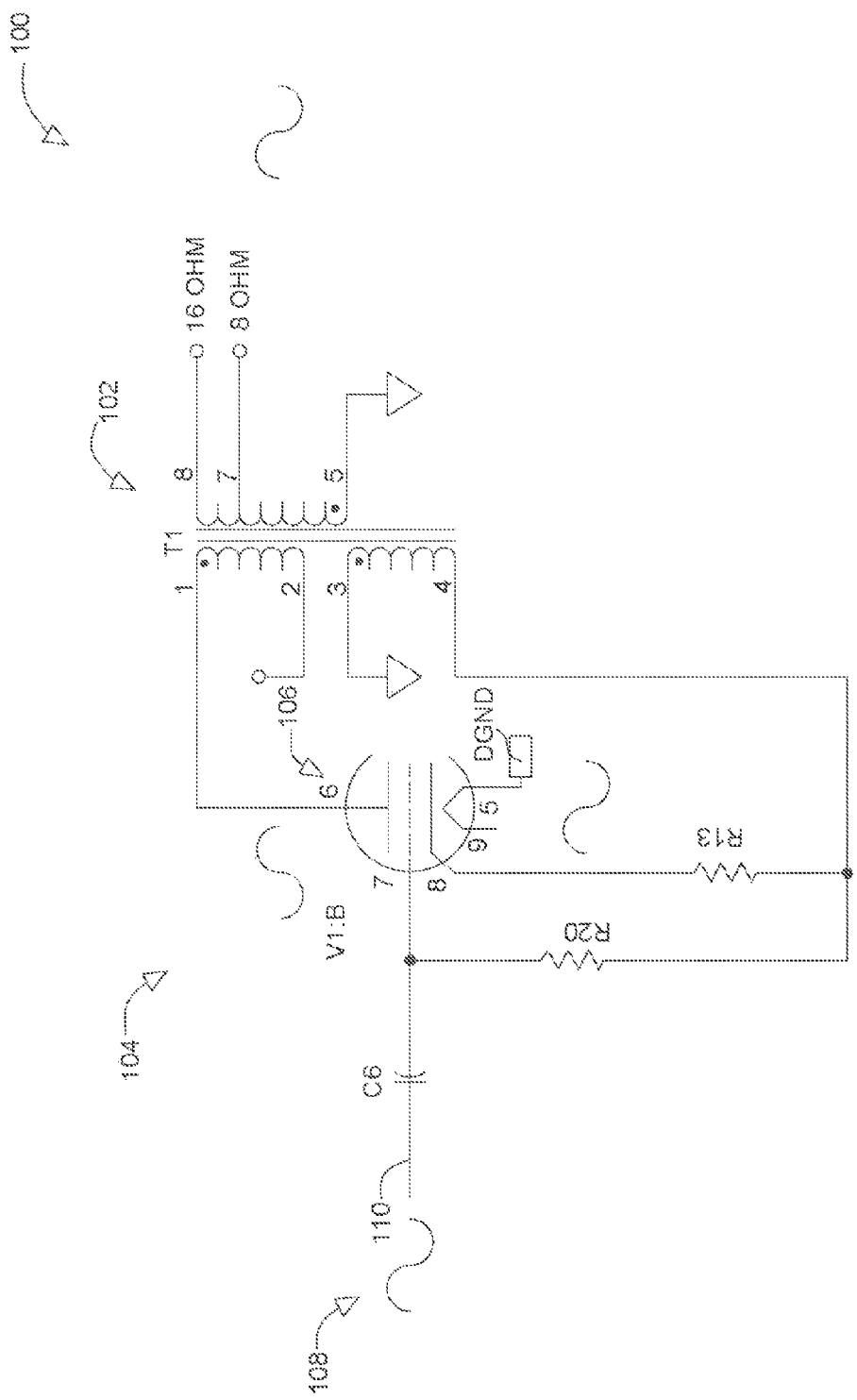
FIG. 1 illustrates a hum and noise cancelling circuit in accordance with the disclosed architecture.

The disclosed amplifier architecture comprises one or more vacuum tubes connected in an arrangement that enables hum and noise cancellation in an output (e.g., a transformer). This capability further enables a substantially reduced footprint in amplifier design that otherwise is not obtainable in a conventional amplifier of equivalent power output. A single-ended output vacuum tube operates, in some respects, similar to a push-pull amplifier configuration with two outputs (but using two tubes).

In a typical push-pull amplifier, undesirable signal components generated by the power supply transformer, include power supply ripple and local EMI (electromagnetic interference) induced noise.

Although similar to a push-pull amplifier arrangement, the disclosed architecture comprises a single-ended (single triode) push-pull (SEPP) low power vacuum tube amplifier that cancels hum and noise in the output transformer load (e.g., audio signal consuming systems such as audio speakers). The SEPP amplifier operates to cancel power supply subsystems (e.g., transformer) induced/coupled ripple and local EMI induced noise in the output transformer of the SEPP amplifier by providing reverse polarity (e.g., 180 degrees) of the primary coils.

The SEPP amplifier differs from a conventional push-pull (P-P) amplifier in that the coils are separate, with a coil connected in the plate circuit of the driving tube and a coil connected in the cathode circuit of the driving tube. The SEPP is a single-ended triode stage floating between the positive and negative phase of the AC (alternating current) cycle, which does not require a phase inverter since the SEPP is inherently phase inverting. Thus, the SEPP does not produce the classic "crossover notch" which occurs during the phase transition across a zero voltage point of a typical Class AB amplifier.

In this sense, the single-ended tube operation floats between the upper winding of the output transformer primary and the lower winding of the primary winding of the output transformer. Rather than having a single center-tapped primary winding on the output transformer, the cancellation architecture employs two identical and separate bifilar wound primaries on the transformer wound for the same polarity. It is the arrangement and connections of the output tube circuit that input inverted and non-inverted hum and noise signals into the transformer primary winding that cancel out.

A first winding 1:2 of the output transformer is connected to an inverted polarity circuit (anode to voltage supply) of the tube, and a second winding 3:4 of the output transformer is connected to the non-inverted polarity circuit (cathode to ground) of the tube. This is not like a typical push-pull circuit for 50% duty cycle; a purpose of the disclosed amplifier circuit is to perform hum and noise cancellation action when in the presence of power supply ripple and EMI (electromagnetic interference) noise.

Hum is typically generated in systems that use alternating current (AC). In audio systems the hum generated by the power circuits and coupled into amplifiers, for example, can ultimately reach the speakers. The fundamental hum frequency is typically twice the electrical cycle (e.g., 50-60 Hz), thus the hum frequency approximates 100-120 Hz, and typically manifests in the amplifiers and loudspeakers.

In vacuum tubes, hum can be generated due to leakage current between the heaters and tube cathodes, such as the emission of electrons from the heater or heater magnetic fields; however, direct current (DC) driven heaters can be provided to prevent the generation of heater hum.

The quality of hum cancellation can be improved based on the amount of bias current of the tube—the more tube current, the better (or greater) the hum cancellation. However, a tradeoff may exist with clean (relatively noise-free) power by managing the tube current. A small amount of imperfection (imbalance in the tube current) is acceptable. This imperfection is controlled by the value of the cathode resistor. Although a fixed (non-variable) resistor, this circuit component (or element) can be a suitably-designed variable resistor. While the grid resistor value can vary somewhat, the combination of the cathode resistor value and the gain of the tube (e.g., a medium μ (mu) triode) provide the desired results. There can be a mixed gain tube (medium μ (mu) triode) and a high gain tube (high μ (mu) triode) in the same package.

The circuit provides the right amount of voltage, the right amount of output power, and the right amount of noise reduction to make this small-chassis product possible.

Varying the cathode resistor can result in increased current in order to get a "fatter", more vintage sound, and with less current, more fidelity. In an alternative embodiment, digital devices can replace the vacuum tubes, such as for example high voltage FET (field effect transistors) devices.

The disclosed architecture combines the power tube function and phase inverter function into a single tube. While not enabling a large amount of output power, the chassis footprint is small to enable a compact power amplifier. In one implementation, a 12DW7 vacuum tube is employed having dual, but not identical, triodes—a high gain triode and a low gain triode. Low gain drives the transformer and the high gain is used as a buffer and a voltage amplifier to drive the low gain triode.

The dual triode design described can employ negative feedback to linearize the performance of the amplifier, which helps reduce background noise to a certain degree, and by linearizing, reduces some distortion, making it sound cleaner.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in diagram form in order to facilitate a description thereof. The intention is to cover all modifications, equivalents, and alternatives falling within the spirit and scope of the claimed subject matter.

FIG. 1 illustrates a hum and noise cancelling (or cancellation) circuit 100 in accordance with the disclosed architecture. The cancellation circuit 100 is defined as comprising a transformer (denoted T1) 102, and a vacuum tube circuit 104 (which includes a vacuum tube 106, and the arrangement of circuit elements (e.g., resistors, capacitors, etc.) and element connections (e.g., to ground, to other circuit elements, etc.) for the vacuum tube 106, and for suitable operation of the vacuum tube 106).

The transformer T1 and vacuum tube circuit 104 define a single-ended push-pull (SEPP) amplifier. The output transformer T1 is tapped (a point of connection on a winding) on the primary and secondary sides, on the secondary side to enable the desired load matching (e.g., 4 ohm, 8 ohm, 16 ohm, etc.).

The vacuum tube 106 is shown as comprising nine terminals for two triode circuits in the vacuum tube 106. In this example circuit, terminals 5-9 (defined as terminals 5, 6, 7, 8, and 9) are utilized for the first of two triodes in the vacuum tube 106.

As shown, the output voltage at the anode (at terminal 6), is inverted relative to the input grid voltage at grid terminal 7 and the cathode voltage at terminal 8. When an input (driving) signal 108 (at input node 110) swings negative, the grid conduction is decreased and the current through the grid (at terminal 7) decreases. (An input capacitor C6 is provided to block the grid voltage from reaching the preceding stage (not shown).) Thus, the voltage decreases across cathode resistor R13 while the anode voltage increases. Inversely, when the input signal 108 swings positive, the voltage increases across the cathode resistor R13 while the anode voltage decreases.

The transformer T1 is shown with a primary winding (on the input side (left) of the transformer T1) tapped with two smaller primary windings: a first primary winding (across terminals 1:2) and a second primary winding (across terminals 3:4). Thus, the hum and noise introduced in the first primary winding across terminals 1:2 by the anode circuit is inverted relative to the hum and noise introduced in the second primary winding across terminals 3:4 by the cathode circuit.

Thus, substantial or complete cancellation of the hum and noise achieved in the primary side of transformer T1 results in little or no hum/noise propagated into the secondary winding(s) (on the output or right side) of the transformer T1, and ultimately into the audio output signals to the audio loads.

The resistor combination R13 and R20 enables a bias current to the tube 106. The greater the amount of tube bias current, the more effective hum/noise cancellation that is obtained. There can be a tradeoff desired between clean power and cancellation efficiency based on management of the tube bias current. However, perfect balance may not be necessary or desirable, since a small amount of imperfection (or imbalance) can provide greater cancellation efficiency. This imperfection is set by the value of the cathode resistor R13. Currently a fixed value, resistor R13 can be implemented as a variable resistance adjustable only via the internal compartment of the chassis or enabled via a front panel adjustment by the user, as desired.

The focus is the benefits of a P-P design, with hum cancellation (low noise) and compact chassis design, all of this in a compact package without concern as to proximity to, for example, the power supply transformer. The compact design is enabled by locating the output transformer T1 and power supply transformer (not shown) in close proximity, which would normally (conventionally) cause the introduction (e.g., induced) of hum/noise into the output transformer T1, as in conventional designs, but because of the disclosed hum/noise cancellation technique, the electrical/hardware components can be close in proximity without undesirable sound artifacts present in the transformer T1 output (secondary winding side).

As shown, the circuit 100 comprises the input conductor 110 connected through the capacitor C6 (into the positive capacitor plate and out the negative capacitor plate) to the grid (dashed line, and denoted at terminal 7) of the tube 106. The AC (alternating current) driving signal 108 is applied to the conductor for the input node 110, which is to the tube grid. Terminals 9:5 (9 and 5) indicate the heater circuit leads to which is applied low DC (direct current) voltages (e.g., 5-20 volts DC) and currents (e.g., milliamps (mAs)). The tube envelope (entire tube package) can comprise twin triodes; however, only one triode tube is shown as employed for cancellation purposes for this transformer T1.

One end of resistor R20 connects to the conductor for the input node 110, but at a point between the negative plate of the capacitor C6 and the grid terminal 7, and the other end of resistor R20 connects to the non-dotted terminal 4 of the second primary winding of the transformer T1. One end of resistor R13 connects to the cathode (terminal 8) and the other end of resistor R13 connects to the other end of resistor R20 (which is the same point as the non-dotted terminal (terminal 4) of the second primary winding of the transformer T1). The dotted terminal (terminal 3) of the second primary winding connects to ground. On the plate side (anode), the plate (terminal 6) connects to the dotted terminal (terminal 1) of the first primary winding, and the non-dotted terminal (terminal 2) of the first primary winding connects to a high voltage supply (e.g., 400 volts AC).

On the secondary side of transformer T1, the dotted terminal (terminal 5) connects to ground, the non-dotted terminal (terminal 8) is tapped for an 8-ohm load (e.g., speaker), and a terminal 7 is tapped for a 16-ohm load (e.g., speaker).

Example component values (e.g., resistors, capacitors, voltages, etc.) in one implementation can be the following: capacitor C6 can be 0.022 micro-farads rated at four hundred volts; resistor R20 can be 470K ohms; resistor R13 can be 470 ohms; the anode voltage can be about 400 volts, and the triode tube can be a model 12AU7 medium gain dual triode tube, a medium gain 12AX7 tube, or a 12DW7 tube, for example.

Figure 2:
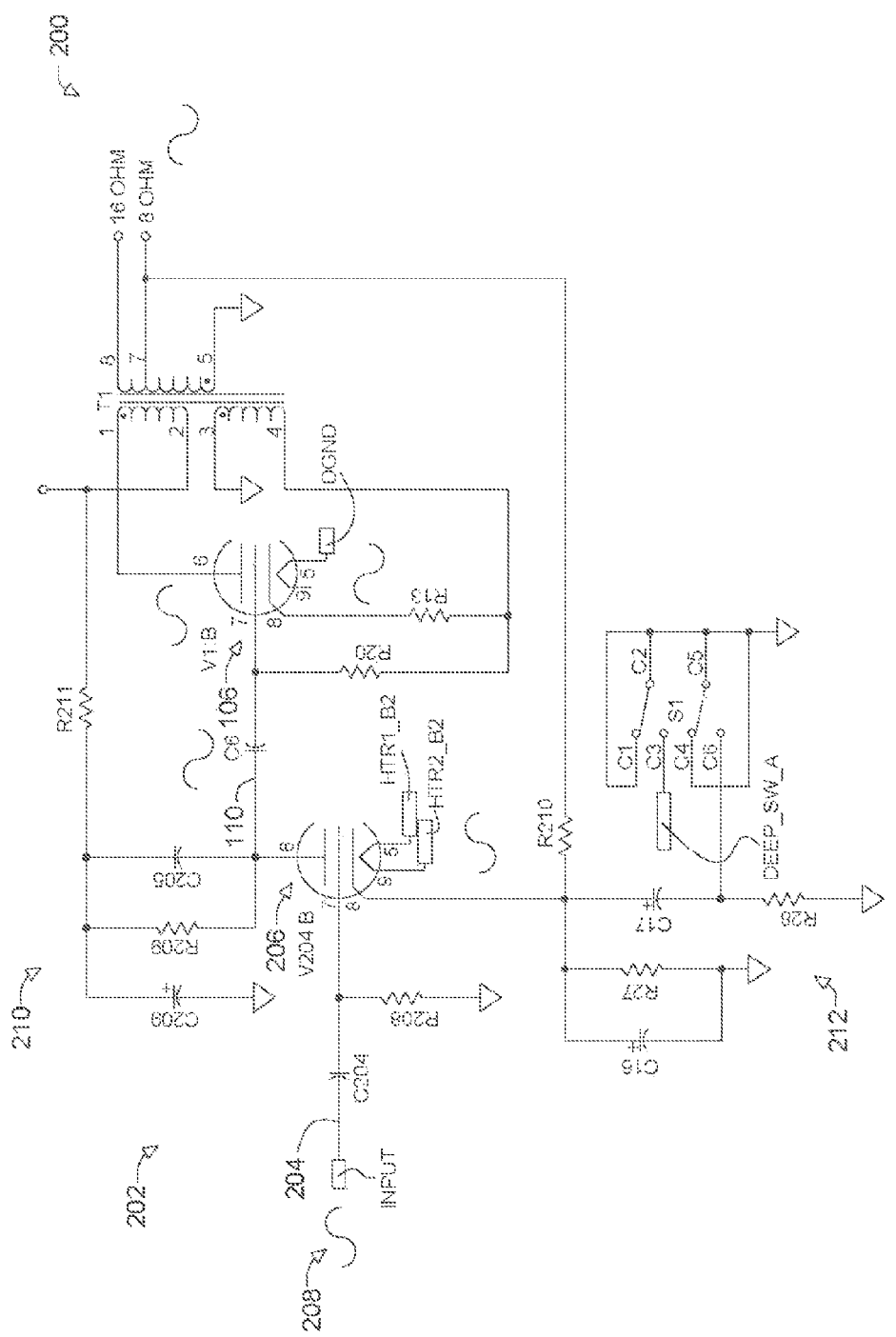
FIG. 2 illustrates an amplifier that incorporates the cancellation circuit in accordance with the disclosed architecture.

FIG. 2 illustrates an amplifier 200 that incorporates the cancellation circuit 100 in accordance with the disclosed architecture. The amplifier 200 includes the circuit 100 of FIG. 1 at the backend, interfacing to the output transformer T1, in addition to a frontend (drive) circuit 202 that comprises a second triode tube 206 for feedback. The drive circuit 202 comprises a conductor 204 for the input signal 208. The input conductor 204 is connected to the negative plate of capacitor C204, and the positive plate of capacitor C204 connects to the grid (dashed line and terminal 7) of the second triode tube 206.

The AC input signal 208 is applied to the conductor 204, through the capacitor C204 to the grid (terminal 7) of the second triode tube 206. As with the first tube 106, pins 9:5 indicate the heater circuit leads to which is applied low DC (direct current) voltages (e.g., 5-20 volts DC) and currents (e.g., milliamps (mAs)).

The tube envelope (package) that comprises tube 206 can also include twin triodes; however, only one triode tube (tube 206) is shown as employed in the drive circuit 202. It can be the case that either of the dual triode tubes (106 and 206) can be employed to provide the single triodes: one triode for the cancellation circuit 100 and one triode for the driving circuit 202; however, this is not a requirement. A resistor R208 connects from the positive plate of the capacitor C204 to ground.

A plate circuit 210 of the drive circuit 202 comprises a capacitor C209, a capacitor C205, a resistor R209, and a resistor R211. One terminal of the resistor R209, the negative plate of capacitor C205, and the positive plate of capacitor C6, all connect to the plate (anode) of the second tube 206 (also terminal 6). The negative plate of capacitor C209 connects to ground, and the positive plate of capacitor C209 connects to the other terminal of resistor R209, the positive plate of capacitor C205, and one terminal of resistor R211. The other terminal of resistor R211 connects to the high voltage terminal at the point of the non-dotted terminal 2 of the first primary winding of the transformer T1. It is noted that the polarity of driving signal 208 input on conductor 204 is 180-degrees out-of-phase from the signal 108 input to the cancellation circuit 100 at conductor 110.

In the cathode circuit 212, a switching arrangement is provided. The cathode circuit 212 comprises a capacitor C16, a capacitor C17, a resistor R27, a resistor R28, a resistor R210, and a DPDT (double pole-double throw) mechanical switch S1. One terminal of each of the capacitor C16 (the positive plate terminal), the capacitor C17 (the positive plate terminal), the resistor R27, and the resistor R210, connect to the cathode at terminal 8 of the second tube 206. The negative plate terminal of capacitor C16 and the other terminal of resistor R27 connect to ground. The negative plate terminal of capacitor C17 connects to one terminal of resistor R28, and an open contact (contact C6) of the switch S1. The other terminal of the resistor R28 connects to ground.

When switch S1 is in a first grounded position, the swingers (also called wipers) of the poles C2 and C5 make contact with ground through the contacts C1 and C4 to cause a first audio effect. In a second position the swingers of the poles C2 and C5 make contact with contacts C3 and C6 to effectively remove resistor R28 from the circuit causing a second audio effect.

Example component values in this implementation can be the following: capacitor C204 can be 0.0047 micro-farads rated at fifty volts, capacitor C16 can be 2.2 micro-farads rated at fifty volts, capacitor C17 can be 47 micro-farads rated at twenty-five volts, capacitor C209 can be 10 micro-farads rated at four hundred fifty volts, capacitor C205 can be 220 pico-farads rated at one kilovolt, and, capacitor C6 can be 0.022 micro-farads rated at four hundred volts. Resistor R208 can be 470K ohms, resistor R27 can be 2.2K ohms, resistor R28 can be 22K ohms, resistor R210 can be 6.8K ohms, resistor R20 can be 470K ohms, resistor R13 can be 470 ohms, resistor R209 can be 270K ohms, and, resistor R11 can be 2.2K ohms. The triode tubes of the second tube 206 (and possibly first tube 106) can be a model 12AU7/ECC82 medium gain dual triode tubes.

Figure 3:
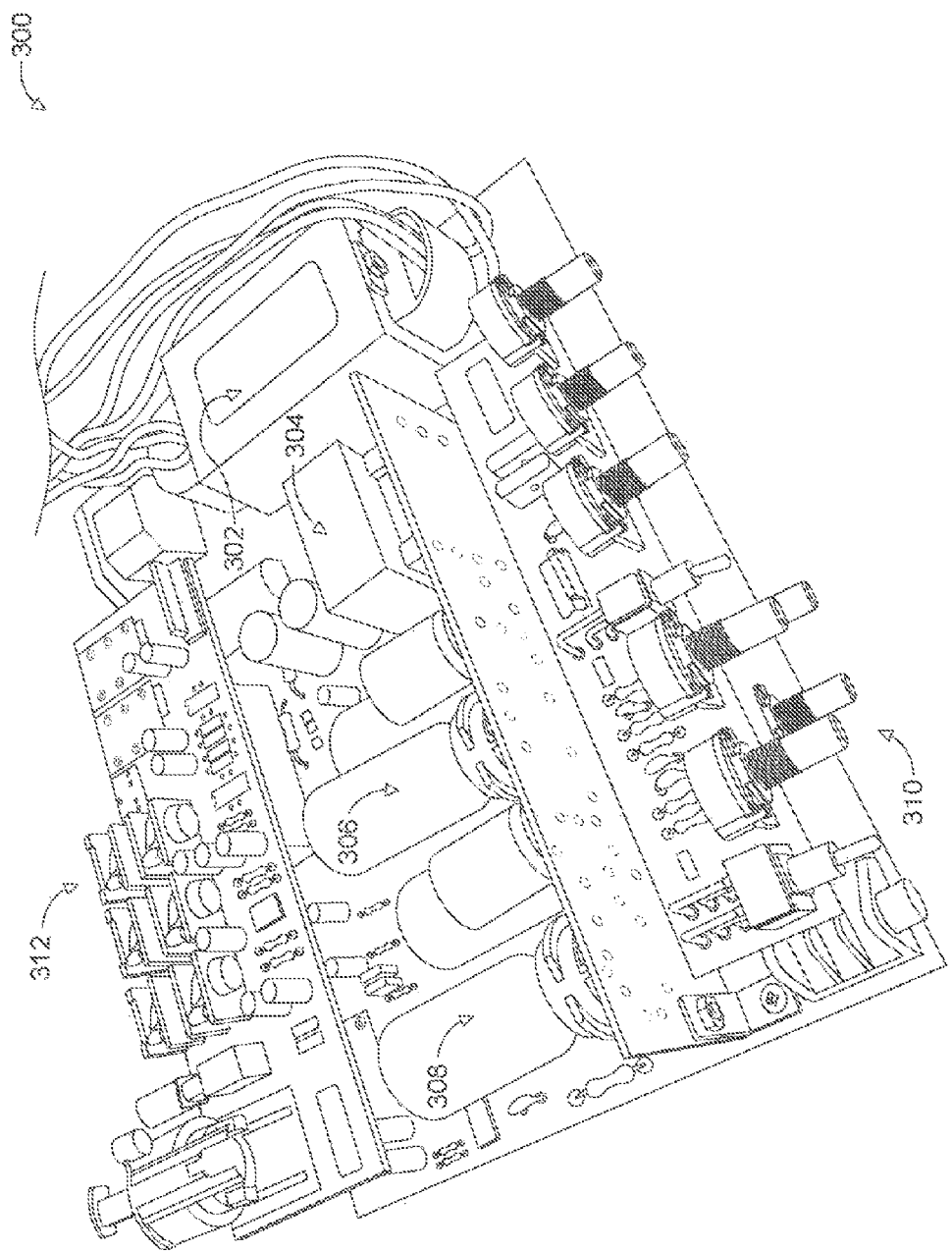
FIG. 3 illustrates an internally mounted small form factor system as a mainboard and secondary board(s) configuration, which overall small size is enabled by the cancellation circuit for implementation of the close proximity power supply transformer and output transformer design.

FIG. 3 illustrates an internally mounted small form factor system 300 as a single mainboard and secondary boards configuration, which overall small size is enabled by the cancellation circuit for implementation of the close proximity power supply and output transformer design.

The system 300 mounts in a chassis (not shown, but which chassis is commonly understood as a box-shaped housing that includes a front panel, a back panel, two side panels, a top panel, and a bottom panel, and commonly-known and understood to be designed to include openings and mounting capabilities to secure the system 300).

The system 300 includes a power supply transformer 302 mounted in close proximity to an output transformer 304 (similar to output transformer T1 in FIGS. 1 and 2), a first vacuum tube 306 (similar to first tube 106 in FIGS. 1 and 2), and a second vacuum tube 308 (similar to second tube 206 in FIG. 2).

Various switches (e.g., rocker, rotary, toggle, multi-position rotary, etc.) and possibly plugs and jacks 310 of the front panel (not shown). The front panel switches can be implemented for suitably-designed functions, to interact with certain electrical components/elements (e.g., variable capacitors, variable resistances, ground connections, etc.), and capabilities (e.g., signal amplitude adjustments, voltage adjustments, etc., for amplifier gain, amplifier equalization, volume control, cabinet and microphone selection, etc.), and for power on/off mechanically and electronically connected to the desired internal components/elements of the system 300 and mounted in, on, and via through-holes of front chassis panel.

Various plugs and switches 312 of the back panel (area) can include power receptacles, audio jacks, speaker jacks, load switching and switches for power on/off any and all of which can be mechanically and electronically connected to the desired internal components of the system 300, as facilitated by being mounted in, on, and via through-holes of the back chassis panel.

The implementation of this small chassis 300 is enabled by the capability of the cancellation circuit 100 in mitigating deleterious hum and noise signals in the output signal to the speakers, for example, or other follow-on systems, that would otherwise be unmanageable in traditional systems when the power supply 302 and output transformer 304 are in such close proximity.

The small-sized form factor of the system 300 facilitates a desktop recording amplifier, which can be an all tube low-power guitar amplifier, preamplifier, direct box, for example, and having an all-around low-volume-playing system. The system 300 can include a one watt, all-tube amplifier with integrated reactive load, a broad tonal range (from clean to high gain), an adjustable "Cab+Mic" section for direct recording, a fully functional self-contained "re-amping" capability or feature, a built-in tube direct injection output, and, is usable separately as a tube direct box or together with the amplifier.

Put another way, a cancellation circuit 100 of an amplifier system is provided, comprising: a transformer T1 (of FIGS. 1 and 2) tapped to match different output loads (e.g., four ohm, eight ohm, sixteen ohm, etc.); and, a vacuum tube circuit 104 having a single vacuum tube (first tube 106), the outputs of the tube which connect to the transformer (T1). The outputs of the tube 106 include an inverted output (anode) and a non-inverted output (cathode) such that when the vacuum tube 106 is powered, an inverted output signal (at the anode) and a non-inverted output signal (at the cathode) are electrically coupled to the transformer T1. The inverted output signal (at the anode) and the non-inverted output signal (at the cathode) operate to mitigate undesirable signal components in the transformer T1 (that would otherwise be generated in the transformer).

The undesirable signal components include hum and locally induced noise. The transformer T1 is an output transformer tapped on a primary winding to create separate primary windings, which include a first primary winding (from terminals 1:2) and a second primary winding (from terminals 3:4). The first primary winding connects to the inverted output (anode) of the vacuum tube 106 and the second primary winding connects to the non-inverted output (cathode) of the vacuum tube 106.

The vacuum tube 106 is configured to electrically float between a positive phase and negative phase of an input power cycle. The vacuum tube 106 is electrically configured as a single-ended push-pull amplifier configuration which avoids a need for a phase inverter. The vacuum tube circuit 202 comprises a second vacuum tube 206 as a frontend drive circuit for feedback (via resistor R210 of FIG. 2).

In another implementation, a cancellation circuit 100 of an amplifier system is provided, comprising: an output transformer (T1) having a primary winding tapped to create at least a first primary winding and a second primary winding; and, a vacuum tube circuit 104 comprising a vacuum tube 106 for amplification of a signal. The output transformer (T1) connects to the vacuum tube 106 to transfer the signal to a load at the transformer output, the vacuum tube 106 having outputs which include an inverted output and a non-inverted output such that when the vacuum tube 106 is powered (e.g., by a power supply), an inverted output signal and a non-inverted output signal are coupled into the output transformer (T1), the inverted output signal and the non-inverted output signal used to mitigate undesirable signal components generated in the output transformer (T1).

The first primary winding connects to a plate circuit of the vacuum tube circuit 104 and the second primary winding connects to a cathode circuit of the vacuum tube circuit 104. More specifically, the first primary winding connects to a plate circuit of the vacuum tube 106 and the second primary winding connects to a cathode circuit of the vacuum tube 106. The output transformer (T1) is an audio transformer which further comprises secondary windings that can connect to various audio output loads. The vacuum tube 106 is a single-ended triode stage that performs phase inversion by floating electrically between a positive voltage phase and a negative voltage phase of an alternating current cycle, thereby eliminating crossover effects.

In yet another implementation, a cancellation circuit is provided in an amplifier system, comprising: an output transformer (T1) having a primary winding tapped to create at least a first primary winding and a second primary winding, and a secondary winding tapped to create multiple secondary windings for corresponding audio loads; and, a single vacuum tube 106, the first and second primary windings of the output transformer (T1) connect to the vacuum tube 106 according to a configuration that enables phase inversion by floating electrically between a positive voltage phase and a negative voltage phase of an alternating current cycle, thereby eliminating crossover effects in an audio signal transferred to the audio loads via the output transformer (T1). The first primary winding connects to a plate circuit of the vacuum tube 106 and the second primary winding connects to a cathode circuit of the vacuum tube 106. The phase inversion enables inverted and non-inverted signals of hum and electromagnetic-induced noise into the transformer primary windings, to cancel, to eliminate the crossover effects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A cancellation circuit of an amplifier system, comprising:
   a transformer tapped to match different output loads; and
   a vacuum tube circuit having a single vacuum tube, the outputs of the tube which connect to the transformer, the outputs of the tube include an inverted output and a non-inverted output such that when the vacuum tube is powered, an inverted output signal and a non-inverted output signal are electrically coupled to the transformer, the inverted output signal and the non-inverted output signal operate to mitigate undesirable signal components in the transformer.

2. The system of claim 1, wherein the undesirable signal components include hum and locally induced noise.

3. The system of claim 1, wherein the transformer is an output transformer tapped on a primary winding to create separate primary windings, which include a first primary winding and a second primary winding.

4. The system of claim 3, wherein the first primary winding connects to the inverted output of the vacuum tube and the second primary winding connects to the non-inverted output of the vacuum tube.

5. The system of claim 1, wherein the vacuum tube is configured to electrically float between a positive phase and negative phase of an input power cycle.

6. The system of claim 1, wherein the vacuum tube is electrically a single-ended push-pull amplifier configuration which avoids a need for a phase inverter.

7. The system of claim 1, wherein the vacuum tube circuit comprises a second vacuum tube as a frontend drive circuit for feedback.

8. A cancellation circuit of an amplifier system, comprising:
   an output transformer having a primary winding tapped to create at least a first primary winding and a second primary winding; and
   a vacuum tube circuit comprising a vacuum tube for amplification of a signal, the output transformer connects to the vacuum tube to transfer the signal to a load at the transformer output, the vacuum tube having outputs which include an inverted output and a non-inverted output such that when the vacuum tube is powered by a power supply, an inverted output signal and a non-inverted output signal are coupled into the output transformer, the inverted output signal and the non-inverted output signal used to mitigate undesirable signal components generated in the output transformer.

9. The system of claim 8, wherein the first primary winding connects to a plate circuit of the vacuum tube circuit and the second primary winding connects to a cathode circuit of the vacuum tube circuit.

10. The system of claim 8, wherein the first primary winding connects to a plate circuit of the vacuum tube and the second primary winding connects to a cathode circuit of the vacuum tube.

11. The system of claim 8, wherein the output transformer is an audio transformer which further comprises secondary windings that can connect to various audio output loads.

12. The system of claim 8, wherein the vacuum tube is a single-ended triode stage that performs phase inversion by floating electrically between a positive voltage phase and a negative voltage phase of an alternating current cycle, thereby eliminating crossover effects.

13. A cancellation circuit of an amplifier system, comprising:
   an output transformer having a primary winding tapped to create at least a first primary winding and a second primary winding, and a secondary winding tapped to create multiple secondary windings for corresponding audio loads; and
   a single vacuum tube, the first and second primary windings of the output transformer connect to the vacuum tube according to a configuration that enables phase inversion by floating electrically between a positive voltage phase and a negative voltage phase of an alternating current cycle, thereby eliminating crossover effects in an audio signal transferred to the audio loads.

14. The system of claim 13, wherein the first primary winding connects to a plate circuit of the vacuum tube and the second primary winding connects to a cathode circuit of the vacuum tube.

15. The system of claim 13, wherein the phase inversion enables inverted and non-inverted signals of hum and electromagnetic-induced noise into the transformer primary windings, which cancel, to eliminate the crossover effects.

* * * * *